United States Patent
Zang et al.

(10) Patent No.: US 10,170,377 B1
(45) Date of Patent: Jan. 1, 2019

(54) MEMORY CELL WITH RECESSED SOURCE/DRAIN CONTACTS TO REDUCE CAPACITANCE

(71) Applicant: GLOBALFOUNDRIES Inc., Grand Cayman (KY)

(72) Inventors: Hui Zang, Guilderland, NY (US); Min-Hwa Chi, Malta, NY (US)

(73) Assignee: GLOBALFOUNDRIES Inc., Grand Cayman (KY)

(*) Notice: Subject to any disclaimer, the term of this patent is extended or adjusted under 35 U.S.C. 154(b) by 0 days.

(21) Appl. No.: 15/709,704

(22) Filed: Sep. 20, 2017

(51) Int. Cl.
| | |
|---|---|
| H01L 21/8239 | (2006.01) |
| H01L 27/11 | (2006.01) |
| H01L 21/8234 | (2006.01) |
| H01L 29/78 | (2006.01) |
| H01L 29/66 | (2006.01) |
| H01L 21/8238 | (2006.01) |

(52) U.S. Cl.
CPC .. H01L 21/8239 (2013.01); H01L 21/823418 (2013.01); H01L 21/823814 (2013.01); H01L 27/11 (2013.01); H01L 29/66636 (2013.01); H01L 29/66833 (2013.01); H01L 29/7835 (2013.01)

(58) Field of Classification Search
CPC ......... H01L 21/8239; H01L 21/823418; H01L 21/823814
See application file for complete search history.

(56) References Cited

U.S. PATENT DOCUMENTS

| | | | |
|---|---|---|---|
| 9,548,366 B1* | 1/2017 | Ho | H01L 29/6656 |
| 9,634,115 B2 | 4/2017 | Xie et al. | |
| 9,741,812 B1* | 8/2017 | Adusumilli | H01L 23/485 |
| 9,899,321 B1* | 2/2018 | Park | H01L 23/528 |
| 2018/0138176 A1* | 5/2018 | Shen | H01L 21/82347 |

OTHER PUBLICATIONS

Office Action from related U.S. Appl. No. 15/709,671 dated Jul. 16, 2018.
Office Action from related U.S. Appl. No. 15/876,316 dated Sep. 12, 2018.

* cited by examiner

*Primary Examiner* — Errol Fernandes
(74) *Attorney, Agent, or Firm* — Amerson Law Firm, PLLC

(57) ABSTRACT

A method includes forming a device above an active region defined in a semiconducting substrate. The device includes a plurality of gate structures, a spacer formed adjacent each of the plurality of gate structures, and conductive source/drain contact structures positioned adjacent each of the plurality of gate structures and separated from the associated gate structure by the spacer. A first portion of the conductive source/drain contact structures of a subset of the plurality of gate structures is recessed at a first axial position along a selected gate structure of the plurality of gate structures to define a cavity. A selected source/drain contact structure is not recessed. A first dielectric layer is formed in the cavity. A conductive line contacting the selected source/drain contact structure in the first axial position is formed.

16 Claims, 18 Drawing Sheets

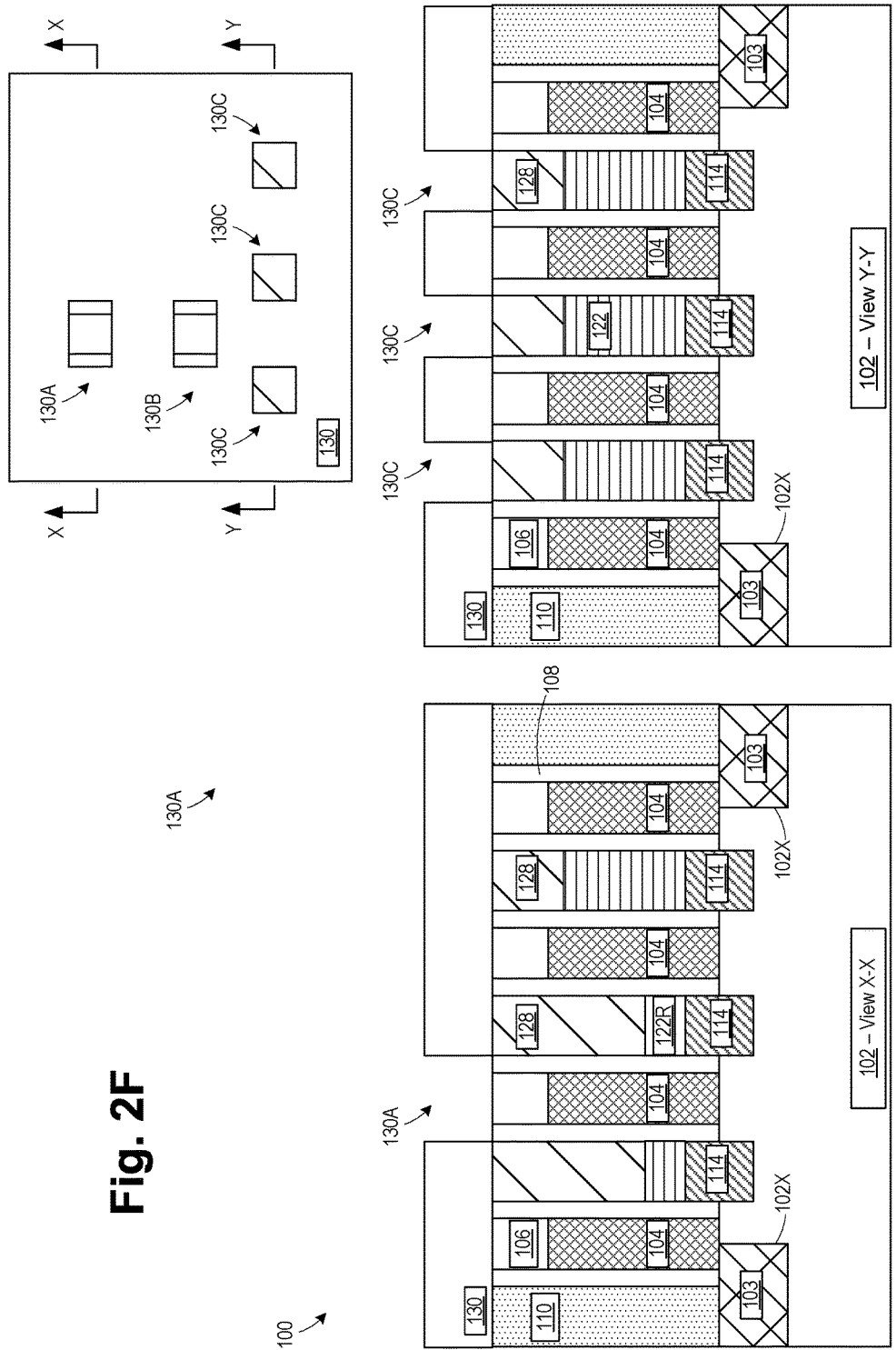

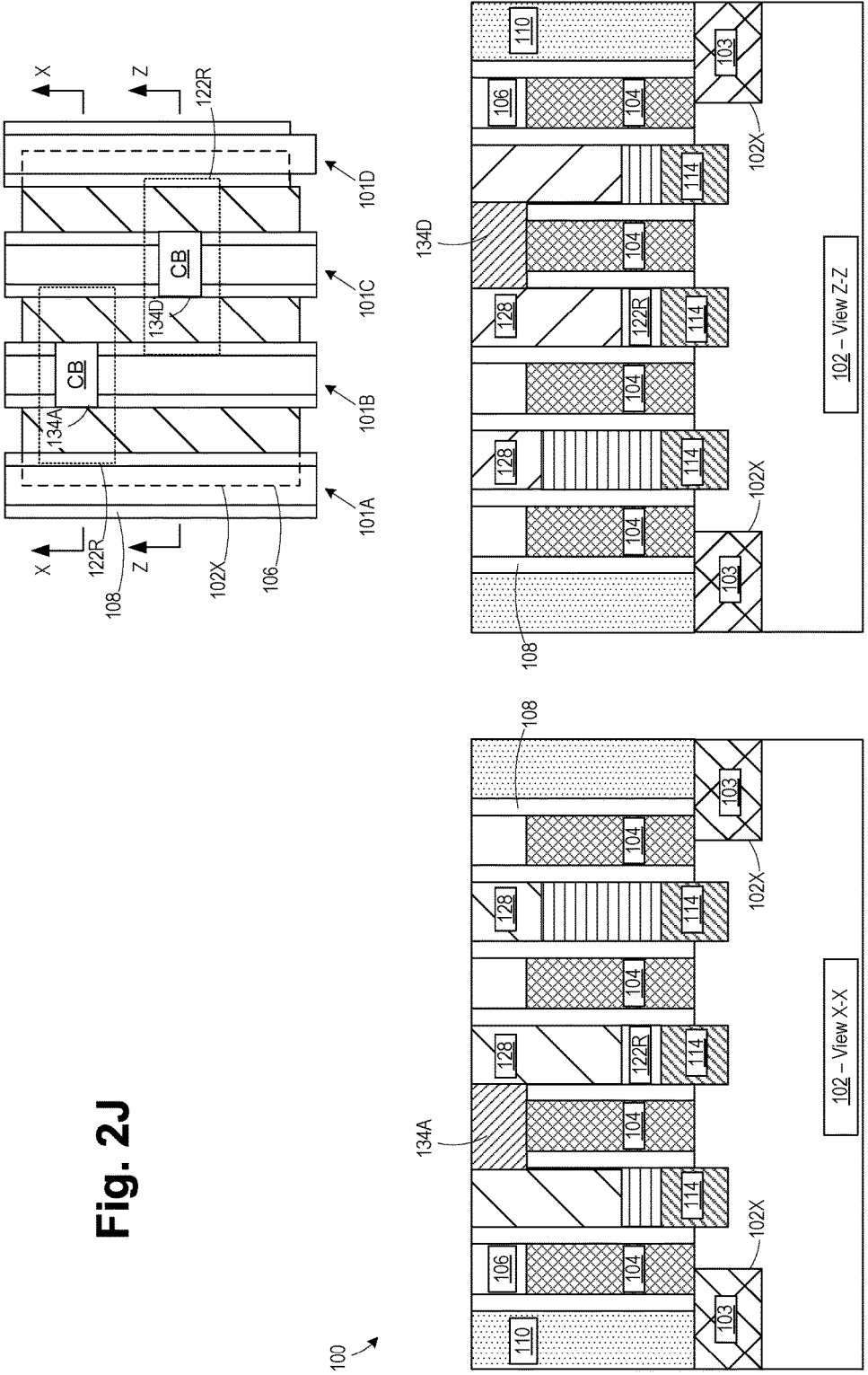

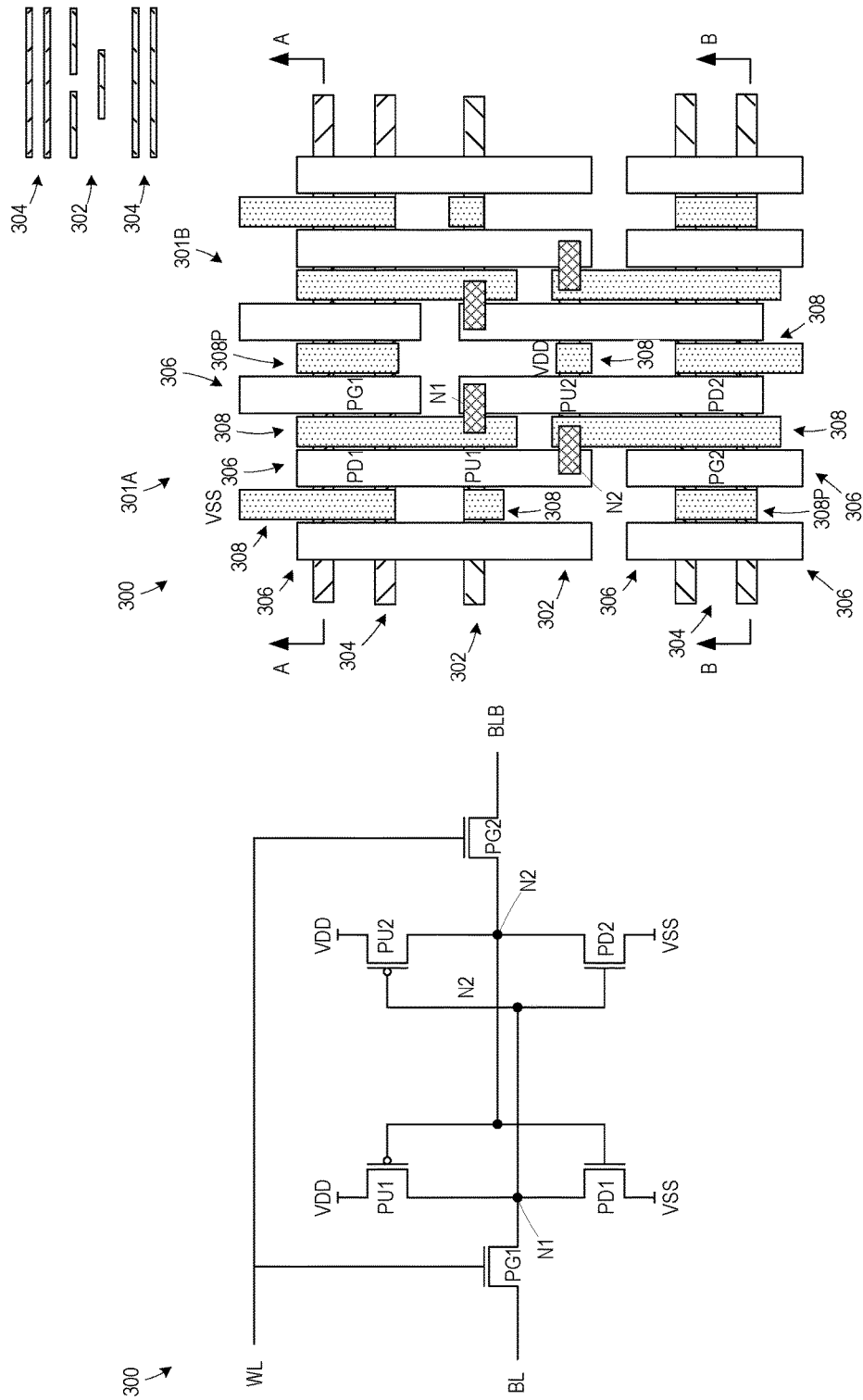

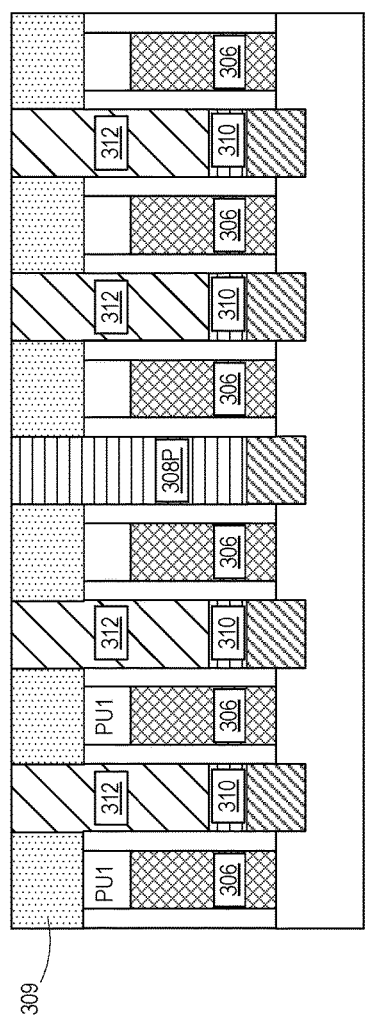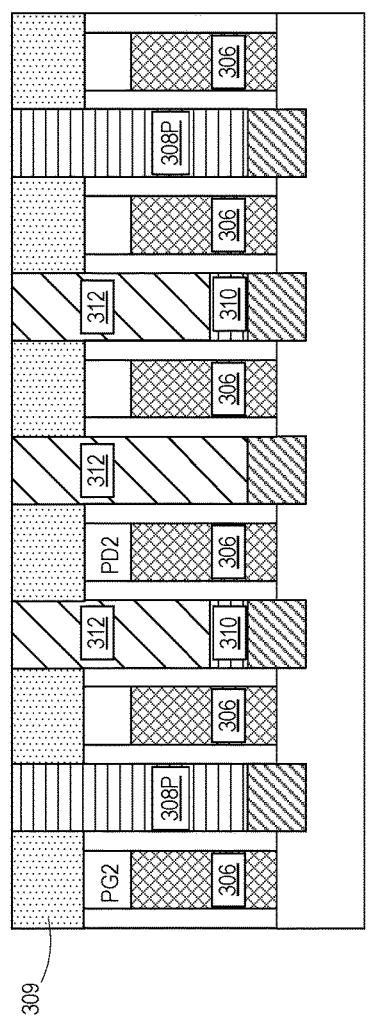

MEMORY CELL WITH RECESSED SOURCE/DRAIN CONTACTS TO REDUCE CAPACITANCE

BACKGROUND OF THE INVENTION

1. Field of the Invention

The present disclosure generally relates to the fabrication of integrated circuits, and, more particularly, to various methods of forming a memory cell with recessed source/drain regions to reduce capacitance and the resulting device.

2. Description of the Related Art

In modern integrated circuits, such as microprocessors, storage devices and the like, a very large number of circuit elements, especially field effect transistors (FETs), are provided and operated on a restricted chip area. FETs come in a variety of different configurations, e.g., planar devices, FinFET devices, nanowire devices, etc. These FET devices are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

To improve the operating speed of FETs, and to increase the density of FETs on an integrated circuit device, device designers have greatly reduced the physical size of FETs over the years, particularly the channel length of transistor devices. As a result of the reduced dimensions of the transistor devices, the operating speed of the circuit components has been increased with every new device generation, and the "packing density," i.e., the number of transistor devices per unit area, in such products has also increased during that time. Typically, due to the large number of circuit elements and the required complex layout of modern integrated circuits, the electrical connections or "wiring arrangement" for the individual circuit elements cannot be established within the same device level on which the circuit elements are manufactured. Accordingly, the various electrical connections that constitute the overall wiring pattern for the integrated circuit product are formed in one or more additional stacked so-called "metallization layers" that are formed above the device level of the product. These metallization layers are typically comprised of layers of insulating material with conductive metal lines or conductive vias formed in the layers of material. Generally, the conductive lines provide the intra-level electrical connections, while the conductive vias provide the inter-level connections or vertical connections between different levels of metal lines. These conductive lines and conductive vias may be comprised of a variety of different materials, e.g., copper, with appropriate barrier layers, etc. The first metallization layer in an integrated circuit product is typically referred to as the "M1" layer, while the conductive vias that are used to establish electrical connection between the M1 layer and lower level conductive structures (explained more fully below) are typically referred to as "V0" vias. The conductive lines and conductive vias in these metallization layers are typically comprised of copper, and they are formed in layers of insulating material using known damascene or dual-damascene techniques.

To provide dielectric separation between the CA contact structures that contact the source/drain regions and the "CB contact" structures that contact the gate structures, the CB gate contact is typically positioned vertically above a region of isolation material that surrounds the device, i.e., the CB gate contacts are typically not positioned above the active region defined in the substrate for the transistor devices. This arrangement decreases achievable packing density.

With reference to FIG. 1, a device 10 includes an illustrative gate structure 12, i.e., a gate insulation (dielectric) layer and a gate electrode (conductive) covered by a cap layer 14 and surrounded by a spacer 16, and simplistically depicted source/drain regions 18. An isolation region 20 has also been formed in the substrate. At the point of fabrication depicted in FIG. 1, layers of insulating material, i.e., interlayer dielectric materials, and other layers of material, such as contact etch stop layers and the like, have been formed above the substrate, but are not depicted. Also depicted are illustrative source/drain contact structures 22 which typically include a so-called "trench silicide" (TS) structure. CA contact structures 24 may be in the form of discrete contact elements, i.e., one or more individual contact plugs having a generally square-like shape (as shown in FIG. 1) or cylindrical shape when viewed from above, that are formed in an interlayer dielectric material. In other applications (not shown in FIG. 1), the CA contact structures 24 may also be a line-type feature that contacts underlying line-type features, e.g., the TS structure 22 that contacts the source/drain region 18 (the TS structure 22 is a line-type feature that typically extends across the entire active region on the source/drain region 18 in a direction that is parallel to that of the gate structure 12). A CB contact 26 contacts the gate structure 12 above the isolation region 20, which is outside the active region. The TS structures 22, CA contacts 24, and the CB contact 26 are all considered to be device-level contacts within the industry.

The CB gate contact 26 is typically positioned above the isolation region 20 so as to avoid or reduce the chances of creating an electrical short between the CB contact 26 and the TS structure 22, i.e., there is a minimum spacing 28 that must be maintained between these two structures according to various design rules in an attempt to prevent such electrical shorts. Unfortunately, there is an area penalty associated with the requirement that the CB contact 26 only be positioned above the isolation region 20.

The present disclosure is directed to various methods of forming a gate contact for a transistor above the active region and the resulting device that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a memory cell with recessed source/drain contacts to reduce capacitance.

A method includes, among other things, forming a device above an active region defined in a semiconducting substrate. The device includes a plurality of gate structures, a spacer formed adjacent each of the plurality of gate structures, and conductive source/drain contact structures positioned adjacent each of the plurality of gate structures and separated from the associated gate structure by the spacer. A first portion of the conductive source/drain contact structures of a subset of the plurality of gate structures is recessed at a first axial position along a selected gate structure of the plurality of gate structures to define a cavity. A selected source/drain contact structure is not recessed. A first dielectric layer is formed in the cavity. A conductive line contacting the selected source/drain contact structure in the first axial position is formed.

Another method includes, among other things, forming a static random access memory (SRAM) device above an active region defined in a semiconducting substrate. The SRAM device includes a plurality of gate structures including a first gate structure associated with a first pass gate transistor and a second gate structure associated with one of a pull-up transistor or a pull-down transistor, and conductive source/drain contact structures positioned adjacent each of the plurality of gate structures. A first portion of the conductive source/drain contact structure associated with the one of the pull-up transistor or the pull-down transistor is recessed at a first axial position along a first gate structure to define a cavity. A first dielectric layer is formed in the cavity. A conductive line contacting the source/drain contact structure of the one of the pull-up transistor or the pull-down transistor in the first axial position is formed.

A device includes, among other things, a plurality of gate structures, a spacer formed adjacent each of the plurality of gate structures, and conductive source/drain contact structures positioned adjacent each of the plurality of gate structures and separated from the associated gate structure by the spacer. A first portion of the conductive source/drain contact structures of a subset of the plurality of gate structures is recessed at a first axial position along a selected gate structure of the plurality of gate structures and a first dielectric layer is positioned above the first portion. A conductive line contacting the selected source/drain contact structure is positioned in the first axial position.

BRIEF DESCRIPTION OF THE DRAWINGS

The disclosure may be understood by reference to the following description taken in conjunction with the accompanying drawings, in which like reference numerals identify like elements, and in which:

FIGS. 2A-2J depict various novel methods disclosed herein for forming a gate contact for a transistor above an active region and recessed source/drain contact regions proximate the gate contact; and FIGS. 3A-3L depict various novel methods disclosed herein for forming recessed source/drain contact regions in a memory device.

Figure 1:
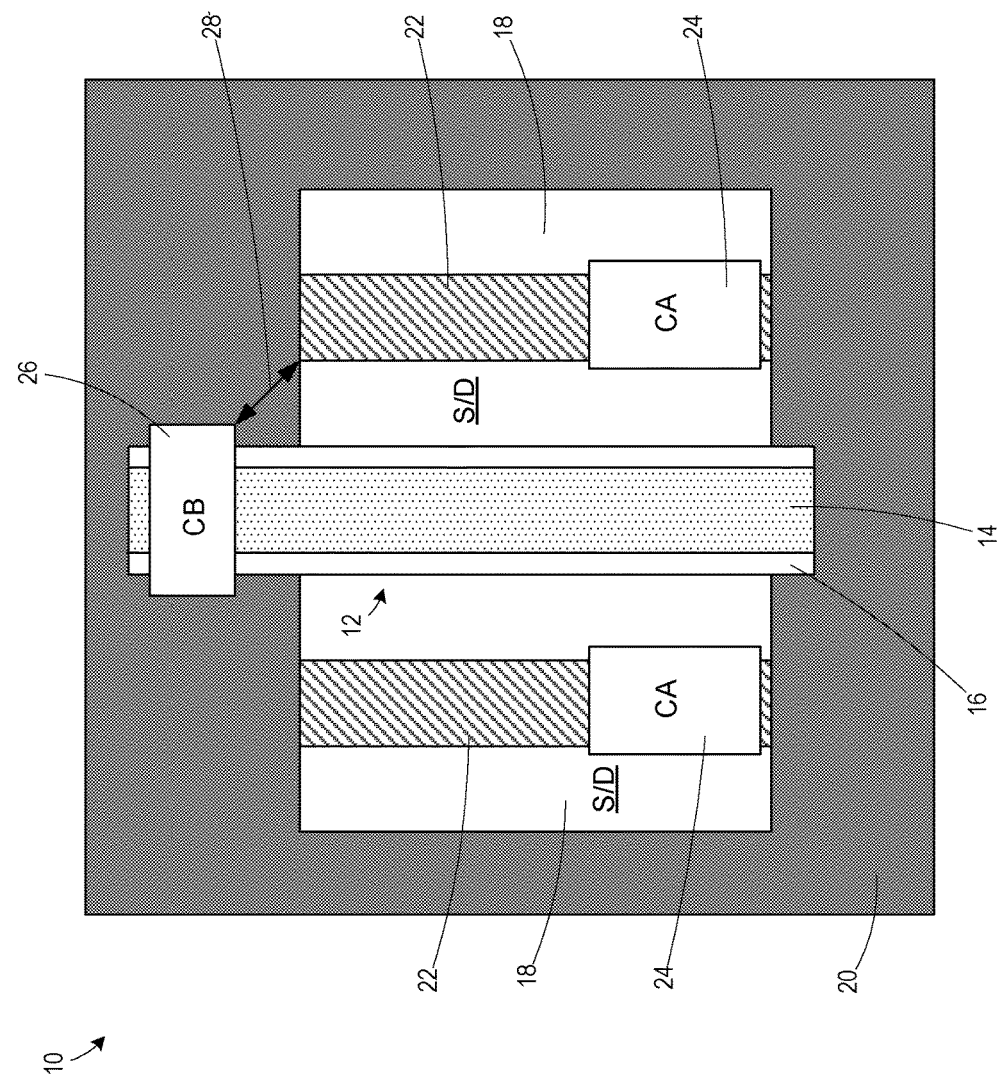
FIG. 1 depicts illustrative prior art arrangements of device-level contacts for an integrated circuit product.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming a gate contact for a transistor above an active region and recessed source/drain contact regions proximate the gate contact and the resulting device. The methods and devices disclosed herein may be employed in manufacturing products using a variety of technologies, e.g., NMOS, PMOS, CMOS, etc., and they may be employed in manufacturing a variety of different devices, e.g., memory products, logic products, ASICs, etc. As will be appreciated by those skilled in the art after a complete reading of the present application, the inventions disclosed herein may be employed in forming integrated circuit products using transistor devices in a variety of different configurations, e.g., planar devices, FinFET devices, nanowire devices, etc. The gate structures for such devices may be formed using either "gate first" or "replacement gate" manufacturing techniques. Thus, the presently disclosed inventions should not be considered to be limited to any particular form of transistors or the manner in which the gate structures of the transistor devices are formed. Of course, the inventions disclosed herein should not be considered to be limited to the illustrative examples depicted and described herein. With reference to the attached figures, various illustrative embodiments of the methods and devices disclosed herein will now be described in more detail. The various layers of material described below may be formed by any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

Figure 2A:

FIGS. 2A-2J depict various novel methods disclosed herein for forming a gate contact for a transistor above an active region and recessed source/drain contact regions proximate the gate contact on an integrated circuit (IC) product 100. Many of the figures contain a simplistic plan view showing where various cross-sectional views are taken in the drawings. The plan view also depicts where an illustrative conductive gate contact structure (CB) will be formed. As indicated in FIG. 2A, the view X-X is a cross-sectional view taken through the device (in a direction corresponding to the gate length direction of the device) at a location where the conductive gate contact structure (CB) will eventually be formed, while the view Y-Y is a cross-sectional view taken through the device (in a direction corresponding to the gate length direction of the device) at a location where a conductive source/drain contact structure (CA) will eventually be formed. It should also be noted that, although some of the figures contain a plan view of the product 100, not all aspects of the processing shown in the cross-sectional views will be depicted in the plan view so as to not overly complicate the drawings.

With continuing reference to FIG. 2A, the illustrative product 100 will be formed in and above a semiconductor substrate 102. In this example, the IC product 100 includes four illustrative laterally spaced-apart gates 101A-D (collectively referenced using the numeral 101) that were formed above the substrate 102. The product 100 may comprise either NMOS transistors, PMOS transistors or both types of transistors. The transistors may be of any desired configuration, e.g., FinFET devices, planar devices, etc. Additionally, various doped regions (e.g., source/drain regions, halo implant regions, well regions and the like) are present but not separately depicted in the attached drawings. The substrate 102 may have a variety of configurations, such as the depicted bulk silicon configuration. The substrate 102 may also have a silicon-on-insulator (SOI) configuration that includes a bulk silicon layer, a buried insulation layer and an active layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials.

FIG. 2A depicts the product 100 at a point in fabrication wherein several process operations have been performed. First, an isolation region 103 was formed in the substrate 102 so as to define an active region 102X where transistor devices will be formed. Next, a plurality of illustrative final gate structures 104, one for each of the gates 101, were formed above the substrate 102. Each of the gates 101 includes a schematically depicted final gate structure 104, a sidewall spacer 108 and a gate cap layer 106. The sidewall spacer 108 was formed by performing a conformal deposition process to form a conformal layer of spacer material, e.g., silicon nitride, above the substrate 102 and thereafter performing an anisotropic etching process. The final gate structure 104 typically includes a gate insulation layer (not separately shown), such as silicon dioxide or a high-k (k value greater than 10) insulating material, and one or more layers of conductive material (not separately shown) that act as the gate electrode, e.g., a metal, a metal alloy, titanium nitride, tantalum nitride, tungsten, aluminum, polysilicon, etc. The sidewall spacer 108 and the gate cap layer 106 are typically comprised of silicon nitride. The final gate structure 104 may be formed using well-known "gate first" or "replacement gate" manufacturing techniques. After the gate structures 104 were formed, an optional epi semiconductor material 114 was formed in the source/drain regions of the transistor devices. The epi semiconductor material 114 need not be formed in all applications. The physical size of the final gate structures 104 and the gate pitch for the final gate structures 104 may vary depending upon the particular application. Also depicted in FIG. 2A is a layer of insulating material 110, e.g. silicon dioxide, that was deposited above the substrate 102 between the laterally spaced-apart gates 101. A planarization process (e.g., a chemical mechanical planarization (CMP) process) was performed on the layer of insulating material 110 using the gate cap layers 106 as a polish-stop. This process operation exposes the upper surface of the gate cap layers 106. Other layers of material that may be present, such as a conformal contact etch stop layer that is formed above the epi material 114, are not depicted in the drawings so as to not overly complicate the drawings.

Figure 2B:
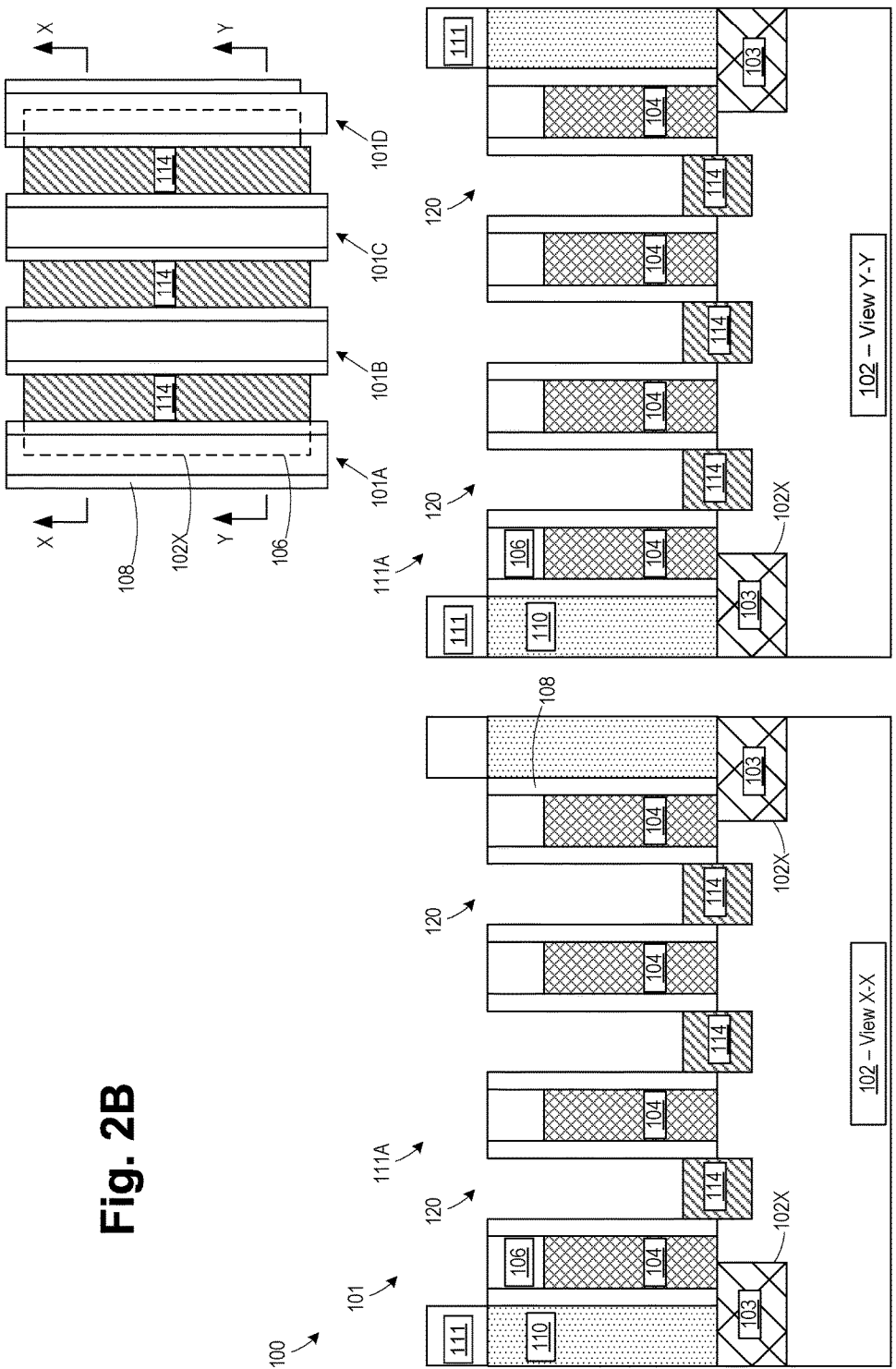

The next major operation involves forming a plurality of conductive source/drain metallization structures so as enable electrical contact with each of the individual source/drain regions of the devices. Accordingly, FIG. 2B depicts the product 100 after several process operations were performed. First, a patterned etch mask 111, with an opening 111A defined therein was formed above the substrate 102. The opening 111A is located above the active region 102X defined in the substrate 102. The patterned etch mask 111 may take a variety of forms and may be comprised of a variety of different materials, e.g., a layer of photoresist, an anti-reflective coating layer and a planarizing layer. The patterned etch mask 111 may be formed using known photolithography tools and techniques. Next, one or more etching processes were performed through the patterned etch mask 111 to selectively remove the exposed portions of the layer of insulating material 110 relative to the surrounding materials and expose the underlying source/drain regions. This process operation defines a plurality of source/drain contact cavities 120.

Figure 2C:
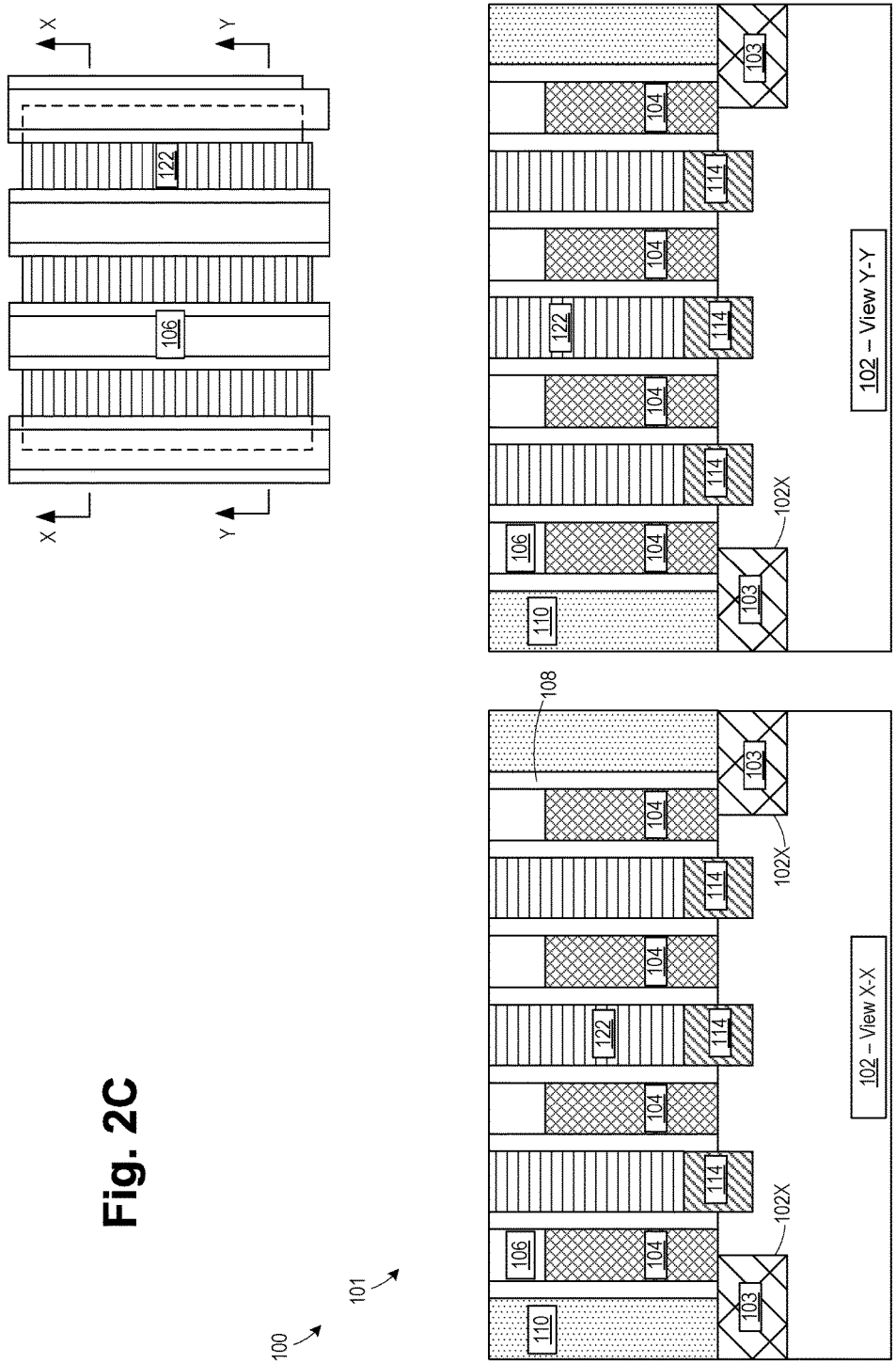

FIG. 2C depicts the product after several process operations were performed. First, the patterned etch mask 111 was removed. Then, a plurality of conductive source/drain metallization structures 122 were formed on the product 100 in the source/drain contact cavities 120. The conductive source/drain metallization structures 122, e.g., trench silicide (TS) containing regions, contact the raised epi source/drain regions 114 (i.e., the source/drain regions) and constitute the conductive source/drain metallization structures that will eventually be conductively coupled to the conductive source/drain contact structures (CA) that are to be subsequently formed on the product 100. Typically, a pre-clean process may be performed prior to forming metal silicide regions (not shown) that physically contact the raised epi material 114. Next, a simplistically depicted conductive source/drain metallization structure 122 was formed in each of the source/drain contact cavities 120 so as to establish contact to their respective source/drain region of the transistor devices. As noted above, the conductive source/drain metallization structures 122 (irrespective of their precise configuration and the manner in which they are made) provide an electrical path between the source/drain regions of the devices (including the raised epi source/drain regions 114) and the conductive source/drain contact structures (CA) that are to be subsequently formed for the product 100. The configuration and structure of the conductive source/drain metallization structures 122 may vary depending upon the particular application. In one example, the conductive source/drain metallization structures 122 are line-type structures that extend into and out of the drawing page in FIG. 2C (see views X-X and Y-Y) that extend for substantially the entire length of the active region (in a direction that corresponds to the gate width direction of the devices). In some cases, the conductive source/drain metallization structures 122 comprise a trench metal silicide material (not separately shown) that is formed on and in contact with the raised epi source/drain regions 114, and a metal material, such as tungsten (not separately shown), that is formed on and in contact with the trench metal silicide material. After the formation of the materials that make up the conductive source/drain metallization structures 122, a chemical mechanical polishing (CMP) process was performed to remove excess materials located above the upper surface of the gate cap layers 106.

Figure 2D:
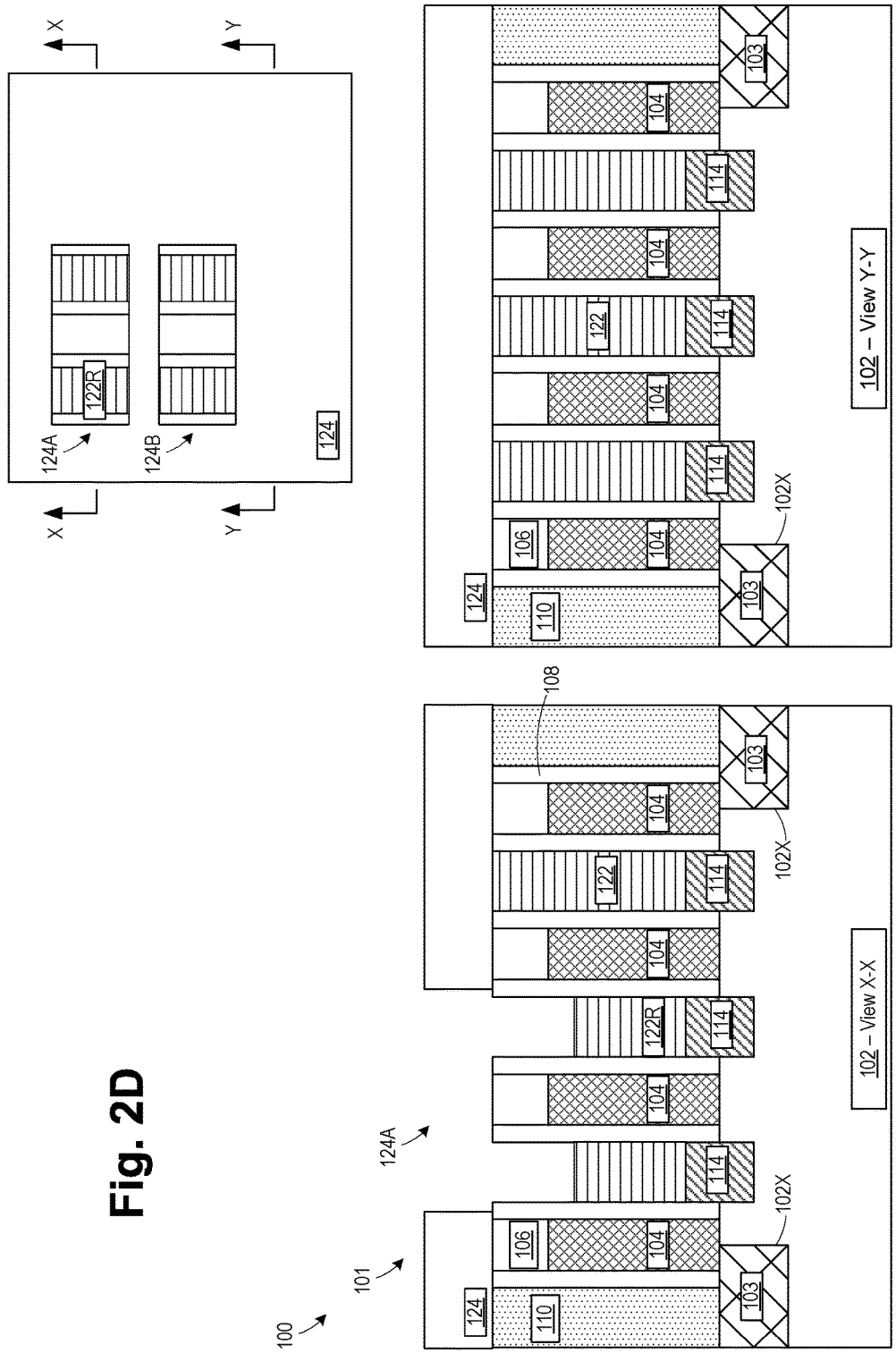

FIG. 2D depicts the product 100 after a patterned masking layer 124 (e.g., OPL, photoresist, etc.) was formed. The masking layer 124 has openings 124A, 124B that expose portions of the conductive source/drain metallization structures 122 adjacent regions where the conductive gate contact structure (CB) will be subsequently formed to contact the gate structures 104 of the gate 101B at a location above the active region. A selective etch process was performed to recess the exposed portions of the conductive source/drain metallization structures 122 to define recessed portions 122R. In one embodiment, the recessed portions 122R have a remaining thickness that is less than about 50% of the original thickness.

Figure 2E:
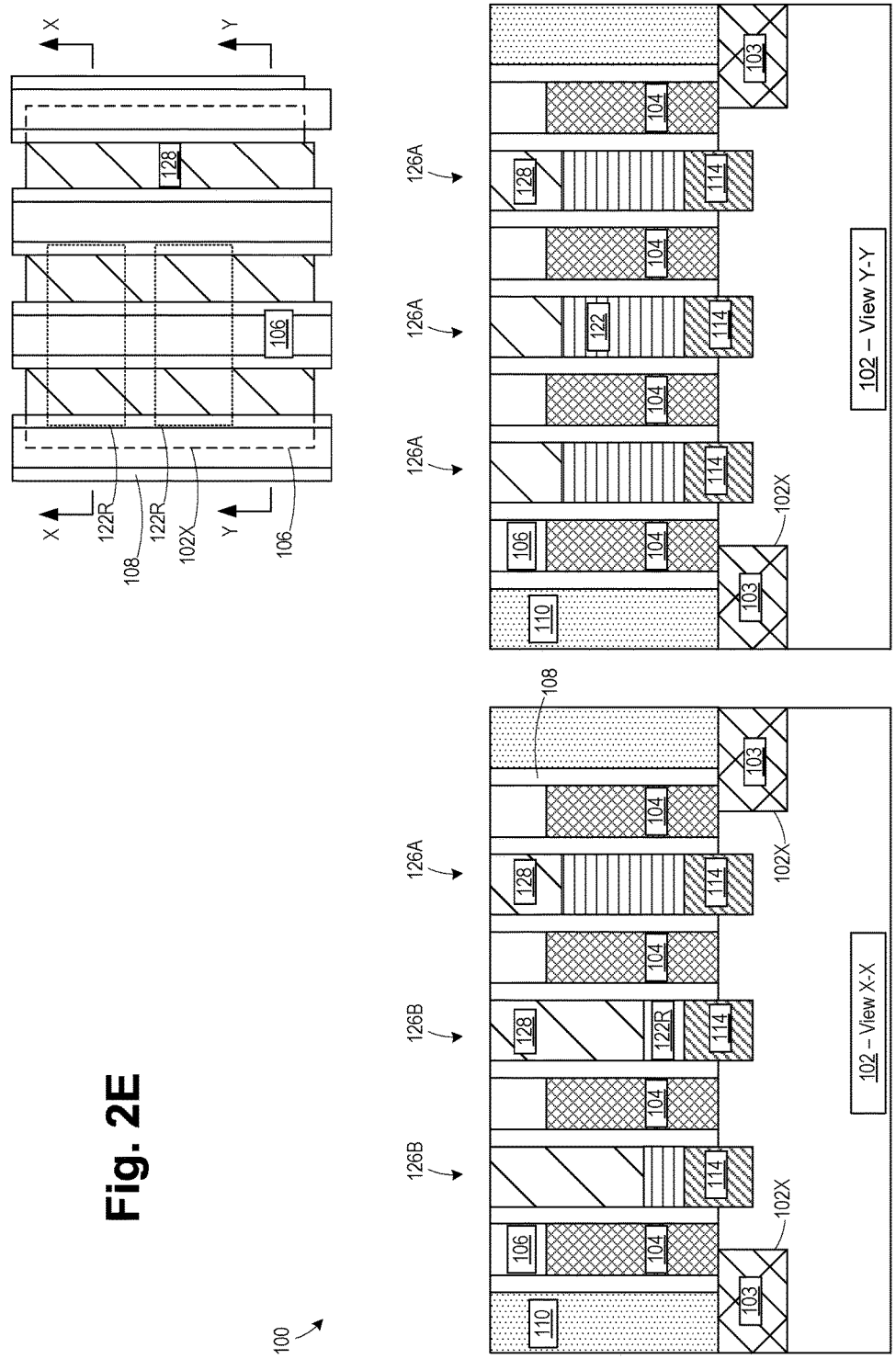

FIG. 2E depicts the product 100 after several processes were performed. First, the patterned masking layer 124 was removed. Another selective etch process was performed to recess all of the conductive source/drain metallization structures 122 to define cavities 126A, 126B and to increase the amount of recessing in the recessed portions 122R. A deposition process was performed to define a cap layer 128 (e.g., silicon nitride) in the cavities 126A, 126B. A planarization process was performed to remove portions of the cap layer 128 extending outside the cavities 126A, 126B. The recessed portions 122R of the conductive source/drain metallization structures 122 are shown in phantom. In some embodiments, the bulk recessing of the conductive source/drain metallization structures 122 to define the cavities 126A may be performed prior to the selective formation of the recessed portions 122R.

With reference to FIG. 2F, a patterned contact masking layer 130 (e.g., OPL, photoresist, etc.) was formed above the product 100. The contact masking layer 130 has openings 130A, 130B that expose portions of the gate 101B adjacent the recessed regions 122R of the conductive source/drain metallization structures 122 at a location above the active region where the conductive gate contact structure (CB) will be formed to contact the gate structure 104 of the gate 101B. The contact masking layer 130 also has openings 130C above non-recessed portions of the conductive source/drain metallization structures 122 where CA contacts will be formed.

Figure 2G:
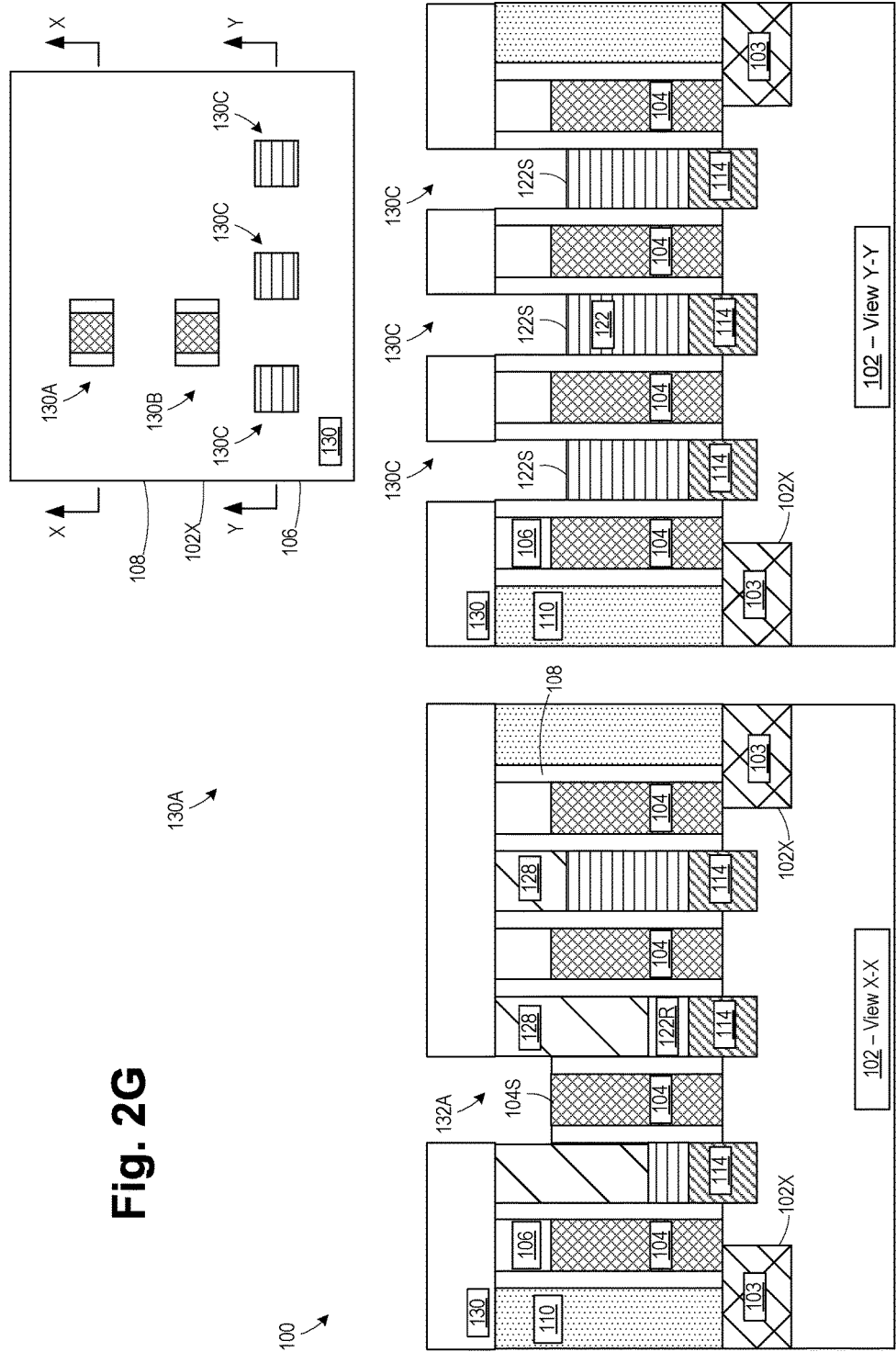

FIG. 2G depicts the product 100 after one or more etching processes were performed through the patterned contact masking layer 130 to selectively remove the portions of the gate cap layer 106 and vertical portions of the sidewall spacer 108 for the gate 101B exposed by the openings 130A, 130B, and to remove the portions of the cap layer 128 exposed by the openings 130C. These process operations expose the upper surface 104S of the axial portion of the gate structure 104 and the upper surfaces 122S of the conductive source/drain metallization structures 122.

In FIG. 2G, the cap layer 128 formed in the cavities 126A provides dielectric separation between the gate structures 101 and the conductive source/drain metallization structures 122. In some embodiments, the bulk recessing of the conductive source/drain metallization structures 122 to define the cavities 126A may be omitted.

Figure 2H:
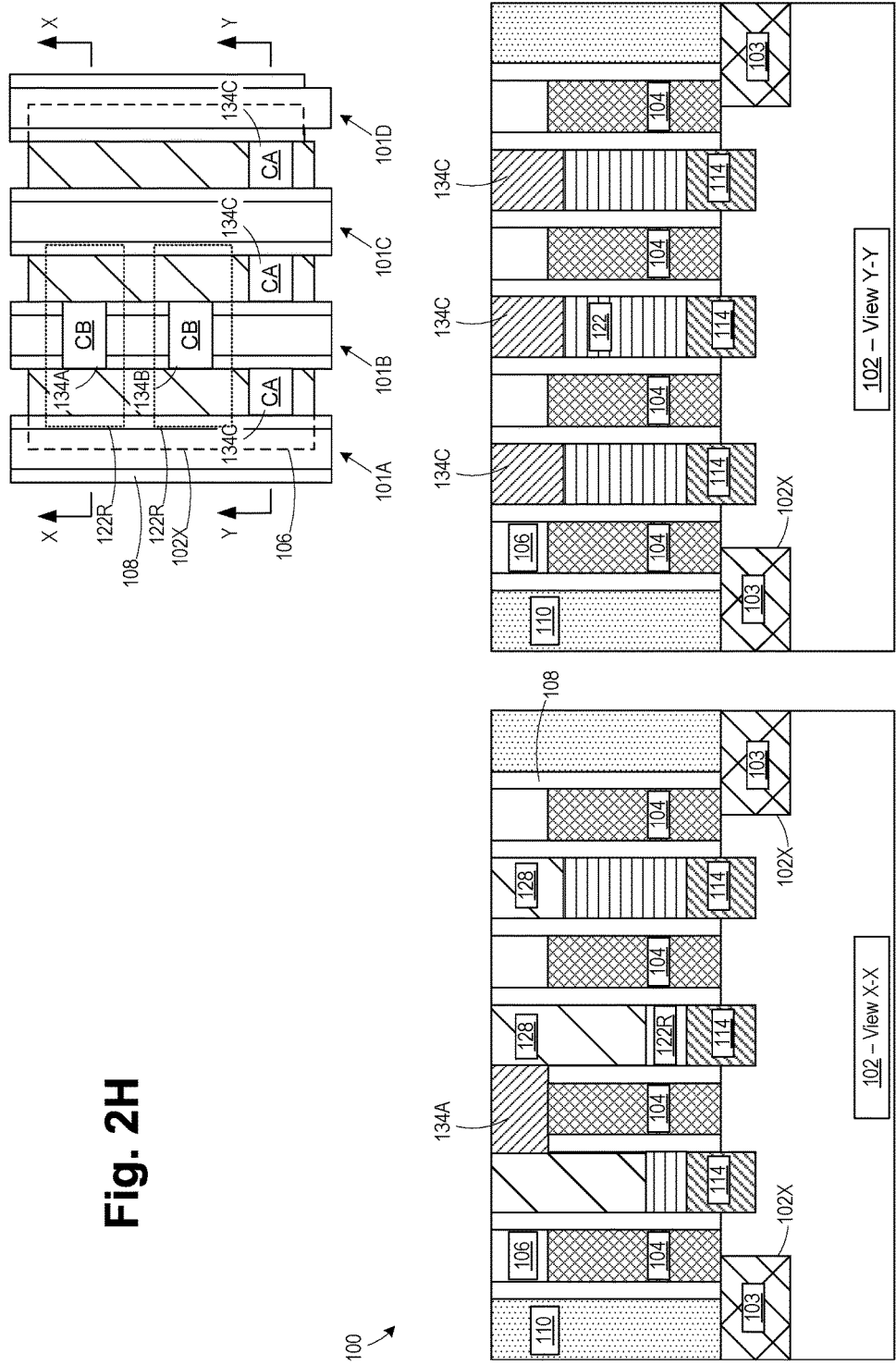

FIG. 2H depicts the product 100 after several process operations were performed. First, the patterned contact masking layer 130 was removed. Thereafter, conductive gate contact (CB) structures 134A, 134B and conductive source/drain (CA) contact structures 134C were formed in the cavities 132A, 132B, 132C, respectively. The conductive contact structures 134A, 134B, 134C are intended to be schematic and representative in nature, as they may be formed using any of a variety of different conductive materials and by performing traditional manufacturing operations. The conductive contact structures 134A, 134B, 134C may also contain one or more barrier layers (not depicted). In one illustrative example, the conductive contact structures 134A, 134B, 134C may be formed by depositing a liner, e.g., Ti, TiN, followed by overfilling the cavities 132A, 132B, 132C with a conductive material, such as tungsten or cobalt. Thereafter, one or more CMP processes may be performed to remove excess portions of the materials of the conductive contact structures 134A, 134B, 134C, e.g., the liner and the tungsten (or cobalt), positioned above and outside of the cavities 132A, 132B, 132C so as to thereby result in the formation of the conductive contact structures 134A, 134B, 134C. The recessed portions 122R of the conductive source/drain metallization structures 122 increase the separation between the CB contact structures 134A, 134B and the conductive source/drain metallization structures 122, thereby allowing the CB contact structures 134A, 134B to be formed above the active region 102X.

Figure 2I:
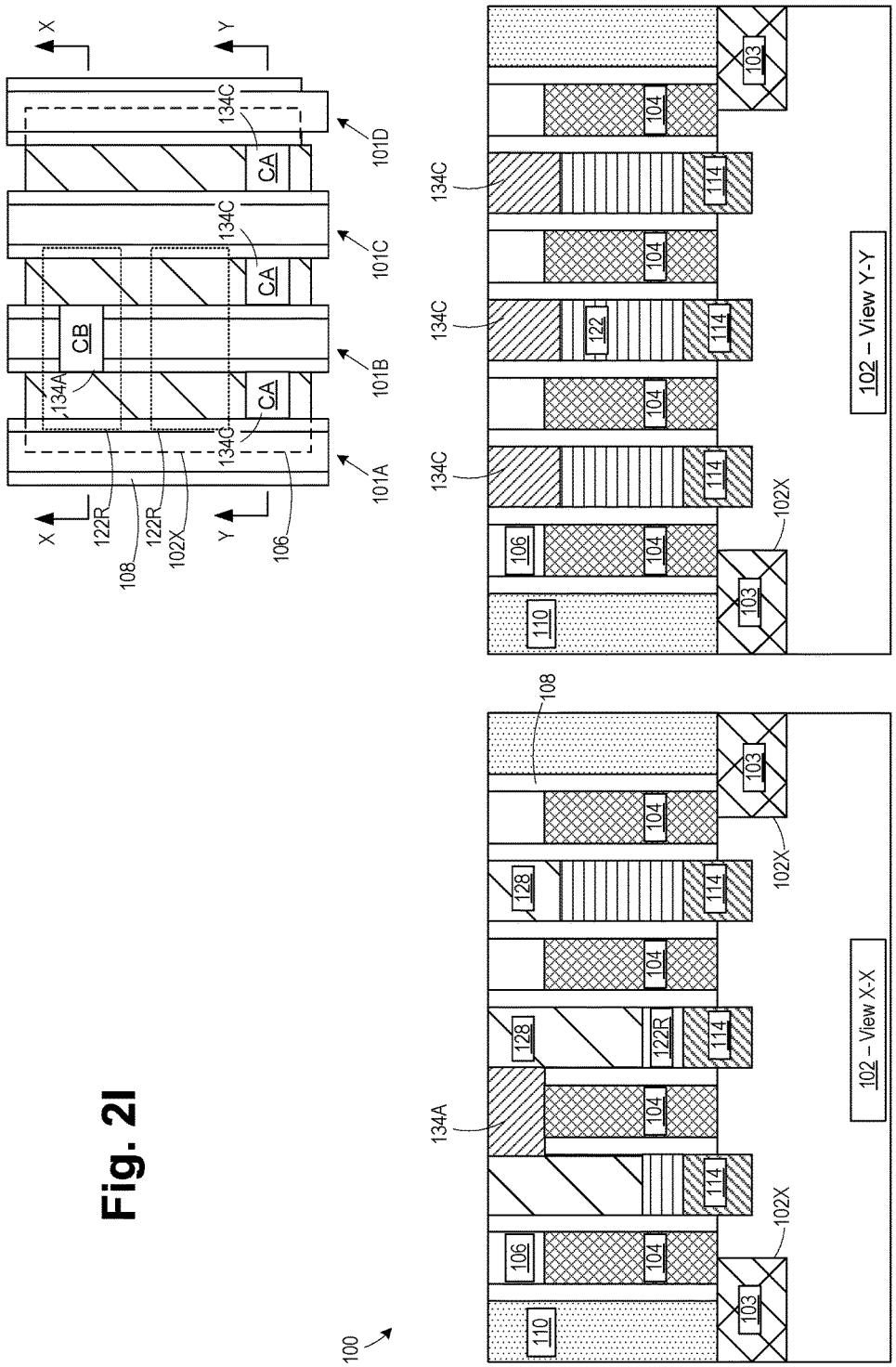

FIG. 2I illustrates an alternative embodiment of the product 100, where the contact opening 130B illustrated in FIG. 2F was omitted. In this embodiment, both recessed portions 122R of the conductive source/drain metallization structures 122 are present, but only the CB contact structure 134A is formed. The embodiment of FIG. 2H allows multiple CB contact structures 134A, 134B to be formed at different axial positions along the same gate structure 101B, while the embodiment of FIG. 2I allows the capacitive characteristics of the conductive source/drain metallization structures 122 to be adjusted along its length by reducing the amount of conductive material at different axial positions.

FIG. 2J illustrates an alternative embodiment of the product 100, where an additional CB contact structure 134D was formed above the gate structure 101C. For ease of illustration, the CA contact structures were omitted and only one CB contact is illustrated on the gate structure 101B. However, different combinations of the contact arrangements may be made, such as including multiple CB contacts on any of the gate structures 101A-101D. The steps illustrated in FIG. 2D for forming the recessed portions 122R were modified to recess a portion of the conductive source/drain metallization structures 122 adjacent the gate structure 101C by providing an additional opening in the mask 124. The steps for forming the contact openings in FIGS. 2F and 2G were also modified to provide an additional opening in the mask layer 130 for the CB contact 134D. The embodiment of FIG. 2J allows multiple CB contacts to be formed that are not aligned with one another.

Figure 3C:
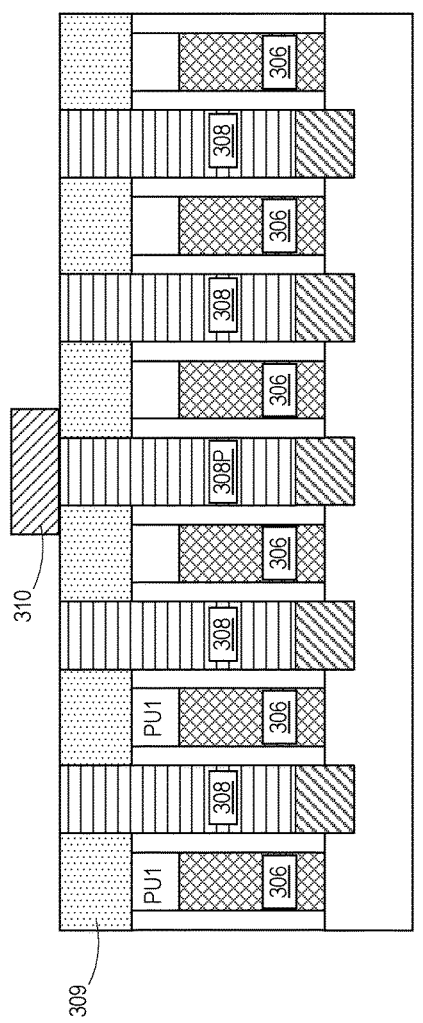

FIGS. 3A-3L illustrate how the techniques described above for selectively recessing the conductive source/drain metallization structures 122 may be applied to a memory device to reduce capacitance. FIGS. 3A and 3B are circuit and layout diagrams of a static random access memory (SRAM) device 300 to which the selective recessing techniques may be applied. As shown in FIG. 3A, a 6T (six transistor) SRAM memory cell 300 includes two NMOS pass gate transistors PG1, PG2, two PMOS pull-up transistors PU1, PU2, and two NMOS pull-down transistors PD1, PD2. Each of the PMOS pull-up transistors PU1, PU2 has its gate connected to the gate of a corresponding NMOS pull-down transistor PD1, PD2. The PMOS pull-up transistors PU1, PU2 have their drain regions connected to the drain regions of corresponding NMOS pull-down transistors PD1, PD2 to form inverters. The source regions of the PMOS pull-up transistors PU1, PU2 are connected to a high reference potential, typically VDD, and the source regions of the NMOS pull-down transistors PD1, PD2 are connected to a lower reference potential, typically VSS or ground. The gates of the PMOS pull-up transistor PUI1 and the NMOS pull-down transistor PD1, which make up one inverter, are connected to the drain regions of the transistors PU2, PD2 of the other inverter. Similarly, the gates of the PMOS pull-up transistor PU2 and the NMOS pull-down transistor PD2, which make up the other inverter, are connected to the drain regions of the transistors PU1, PD1. Hence, the potential present on the drain regions of the transistors PU1, PD1 (node N1) of the first inverter is applied to the gates of transistors PU2, PD2 of the second inverter and the charge serves to keep the second inverter in an ON or OFF state. The logically opposite potential is present on the drain regions of the transistors PU2, PD2 (node N2) of the second inverter and on the gates of the transistors PU1, PD1 of the first inverter, keeping the first inverter in the complementary OFF or ON state relative to the second inverter. Thus, the latch of the illustrated SRAM cell 300 has two stable states: a first state with a predefined potential present on charge storage node N1 and a low potential on charge storage node N2; and a second state with a low potential on charge storage node N1 and the predefined potential on charge storage node N2. Binary data are recorded by toggling between the two states of the latch. Sufficient charge must be stored on the charge storage node, and thus on the coupled gates of the associated inverter, to unambiguously hold one of the inverters "ON" and unambiguously hold the other of the inverters "OFF", thereby preserving the memory state. The stability of an SRAM cell 300 can be quantified by the margin by which the potential on the charge storage nodes can vary from its nominal value while still keeping the SRAM cell in its original state.

Data is read out of the SRAM device 300 in a non-destructive manner by selectively coupling each charge storage node (N1, N2) to a corresponding one of a pair of complementary bit lines (BL, BLB). The selective coupling is accomplished by the aforementioned pass gate transistors PG1, PG2, where each pass gate transistor is connected between one of the charge storage nodes (N1, N2) and one of the complementary bit lines (BL, BLB). Word line signals are provided to the gates of the pass gate transistors PG1, PG2 to switch the pass gate transistors ON during data read operations. Charge flows through the ON pass gate transistors to or from the charge storage nodes (N1, N2), discharging one of the bit lines and charging the other of the bit lines. The voltage changes on the bit lines are sensed by a differential amplifier (not shown).

Prior to a read operation, the bit lines BL, BLB are typically equalized at a voltage midway between the high and low reference voltages, typically ½ (VDD-VSS), and then a signal on the word line WL turns the pass gate transistors PG1, PG2 ON. As an example, consider that N1 is charged to a predetermined potential of VDD and N2 is charged to a lower potential VSS. When the pass gate transistors PG1, PG2 turn ON, charge begins flowing from node N1 through pass gate transistor PG1 to bit line BL. The charge on node N1 begins to drain off to the bit line BL and is replenished by charge flowing through pull-up transistor PU1 to node N1. At the same time, charge flows from bit line BLB through pass gate transistor PG2 to node N2 and the charge flows from the node N2 through the pull-down transistor PD2. To the extent that more current flows through pass gate transistor PG1 than flows through pull-up transistor PU1, charge begins to drain from the node N1, which, on diminishing to a certain level, can begin turning OFF pull-down transistor PD2. To the extent that more current flows through pass transistor PG2 than flows through pull-down transistor PD2, charge begins to accumulate on charge storage node N2, which, on charging to a certain level, can begin turning OFF pull-up transistor PU1.

FIG. 3B illustrates the physical layout of the SRAM device 300 without the bit lines (BL) and word lines (WL) shown. The SRAM device 300 of FIG. 3B has a first cell 301A and a second cell 301B that are mirror images of one another. The circuit of FIG. 3A represents a single one of the cells 301A, 301B. The SRAM device 300 is implemented using a plurality of pFET fins 302 and nFET fins 304. Gate structures 306 and source/drain contacts 308 for the various transistors are provided in the layout shown. Some of the gate structures (e.g., those not labeled as parts of the SRAM cell) may be dummy gate structures to maintain pattern density. Because the fins are difficult to see due to the overlying features, the fin layout is illustrated in miniature in the top right corner of FIG. 3B. FIG. 3C is a cross-sectional view A-A taken through the SRAM device 300 through PG1, and FIG. 3D is a cross-sectional view B-B taken through the SRAM device 300 through PG2.

Figure 3D:
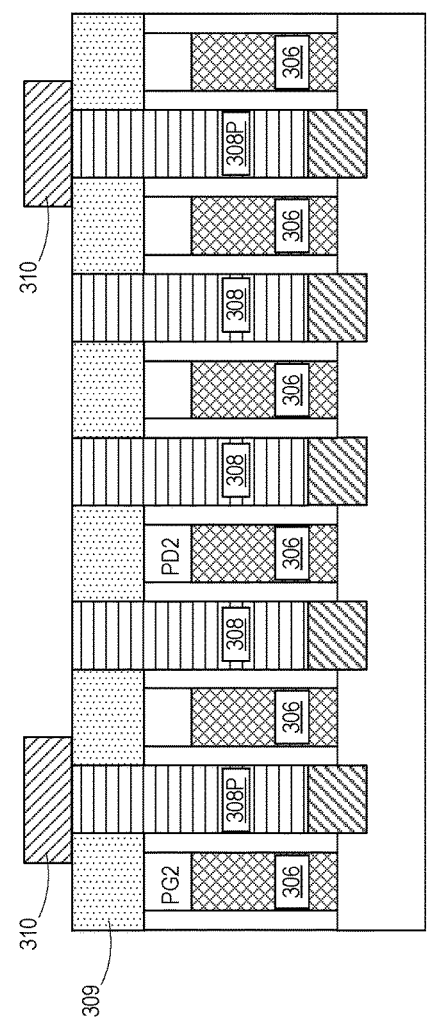

As shown in FIGS. 3C and 3D, dielectric layer 309 (e.g., silicon dioxide, low-k dielectric or ultra-low-k dielectric) was formed above the gate structures 306 prior to formation of the source/drain contacts 308 such that the source/drain contacts 308 are embedded in the dielectric layer 309. A patterned masking layer 310 (e.g., OPL, photoresist, etc.) is formed above the device 300 over portions of the source/drain contacts 308P of the pass gates, PG1, PG2.

Figure 3E:
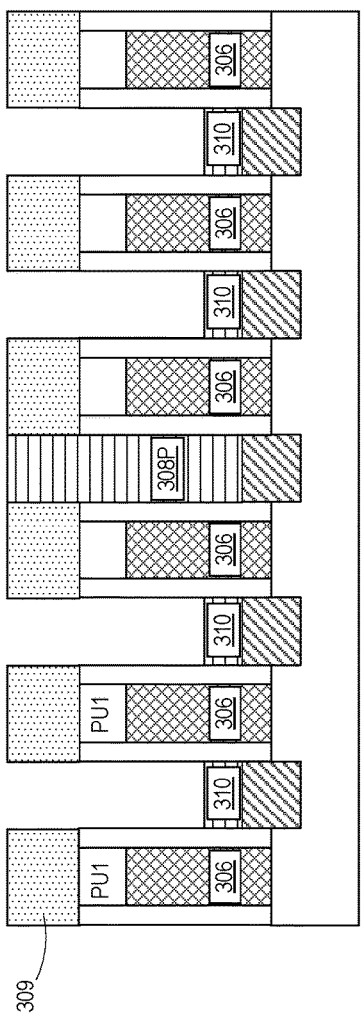
Figure 3F:
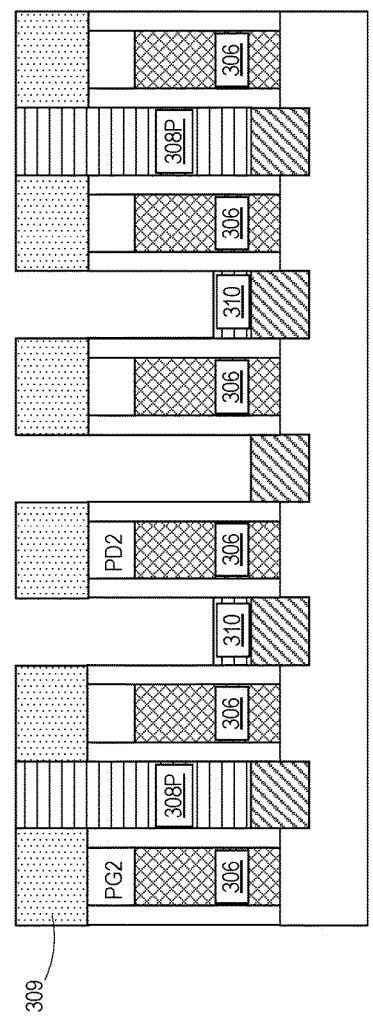

FIGS. 3E and 3F illustrate the SRAM device 300 after an etch process was performed using the patterned masking layer 309 to selectively recess portions of the source/drain contact regions 308 to define recessed regions 310 and after removal of the patterned masking layer 310. In some embodiments, at least half of the thickness of the source/drain contact regions 308 is removed.

Figure 3G:
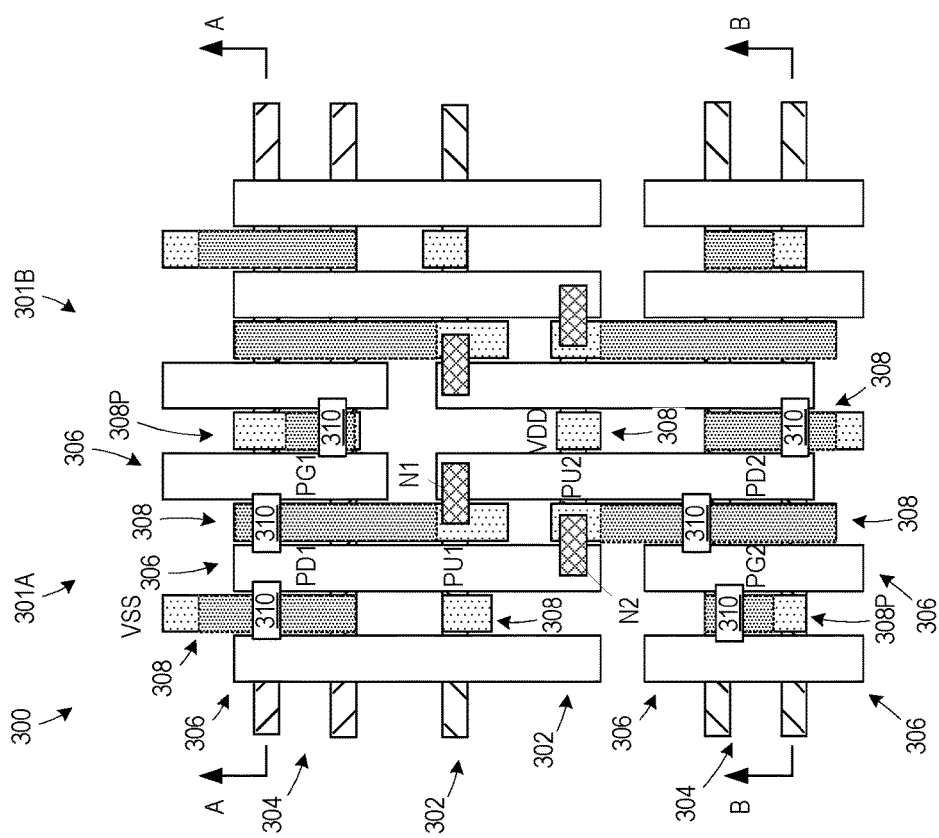

FIG. 3G is a layout view of the SRAM device 300 with the recessed regions 310 in the source/drain contacts 308. The patterned masking layer 309 has openings corresponding to the recessed regions 310.

FIGS. 3H and 3I illustrate the device 300 after one or more processes were performed to form a dielectric cap layer 312 (e.g., low-k dielectric or ultra-low-k dielectric) above the recessed regions 310. A deposition process was performed to fill the cavities formed by recessing the source/drain contacts 308 with a material of the dielectric cap layer 312, and a planarization process was performed to remove portions extending outside the cavities.

Figure 3J:
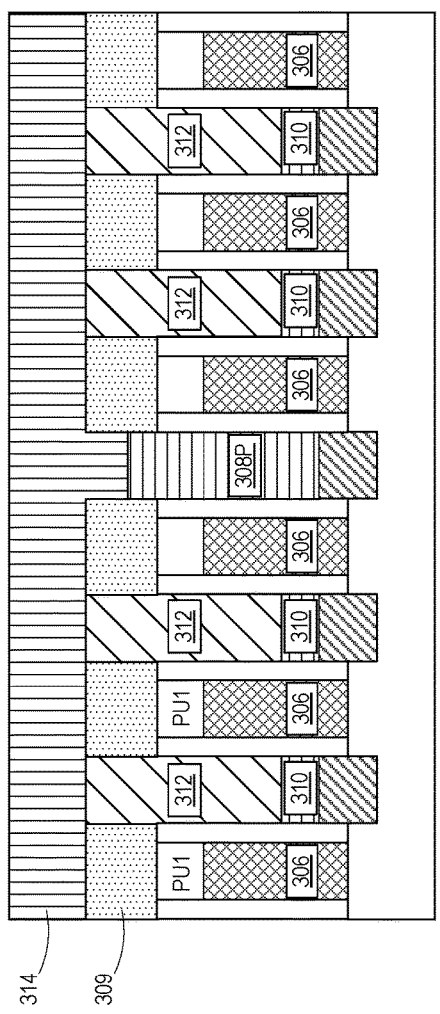
Figure 3K:
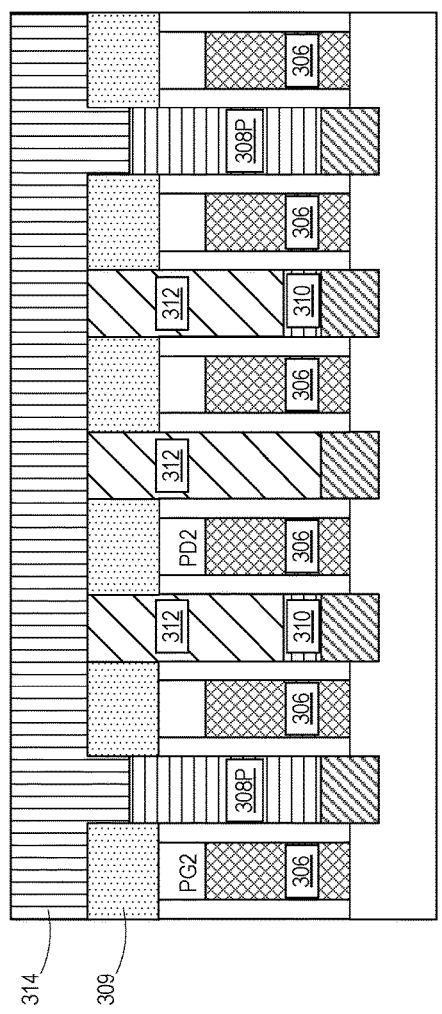

FIGS. 3J and 3K illustrate the device 300 after one or more processes were performed to form bit lines 314 above and contacting the source/drain contacts 308P of the pass gates. A dielectric layer (not visible since the trenches are shown in FIGS. 3J and 3K) was formed above the device and patterned to form trenches that expose the source/drain contacts 308P. An optional recess etch was performed to recess the exposed portions of the source/drain contacts 308P. A deposition process was performed to form a conductive material in the trenches to thereby define the bit lines 314.

Figure 3L:
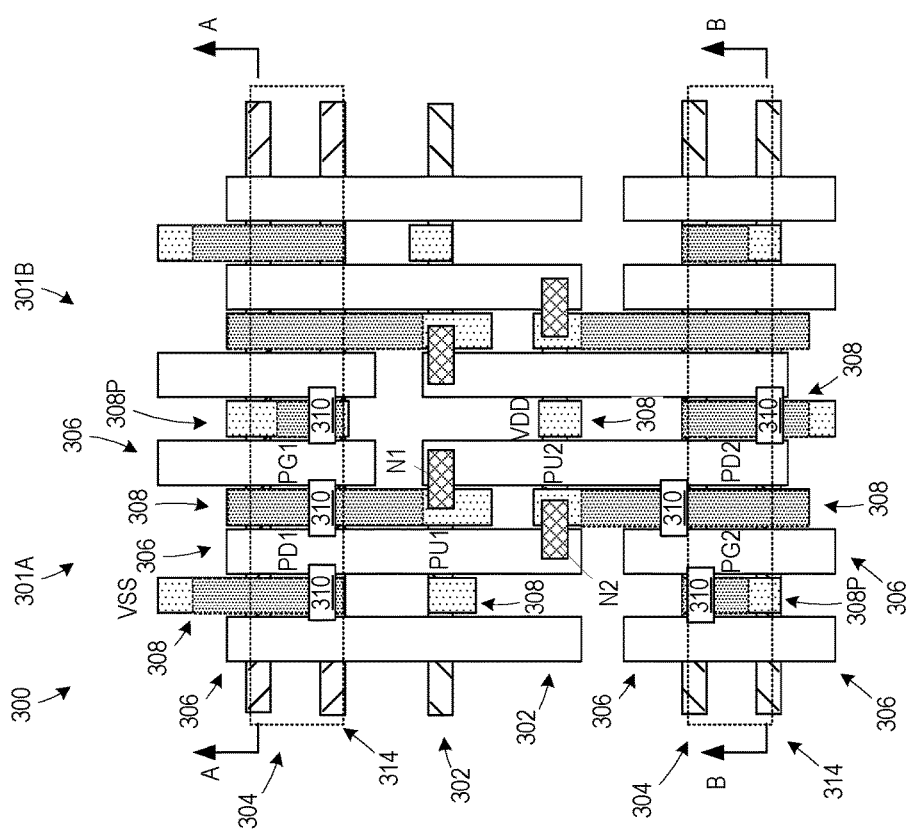

FIG. 3L is a layout view of the SRAM device 300 showing the bit lines 314 in phantom. Because the source/drain contacts 308 adjacent PG1 and PG2 are recessed, the capacitance between the bit lines 314 and the source/drain contacts 308 is reduced, thereby increasing the performance of the SRAM device 300 (e.g., in terms of speed, density, etc.).

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   forming a device above an active region defined in a semiconducting substrate, said device comprising a plurality of gate structures, a spacer formed adjacent each of said plurality of gate structures, and conductive source/drain contact structures positioned adjacent each of said plurality of gate structures and separated from an associated gate structure by said spacer;
   recessing a first portion of said conductive source/drain contact structures of a subset of said plurality of gate structures at a first axial position along a selected gate structure of said plurality of gate structures to define a cavity, wherein a selected source/drain contact structure is not recessed;
   forming a first dielectric layer in said cavity; and
   forming a conductive line contacting said selected source/drain contact structure in said first axial position.

2. The method of claim 1, wherein said conductive line has a first axial length in a direction perpendicular to a second axial length of said selected source/drain contact structure.

3. The method of claim 1, further comprising:
   forming a second dielectric layer above said conductive source/drain contact structures;
   forming a trench in said second dielectric layer exposing said selected source/drain contact structure; and
   forming said conductive line in the trench.

4. The method of claim 3, further comprising recessing said selected source/drain contact structure after forming said first dielectric layer and prior to forming said conductive line.

5. The method of claim 1, wherein said plurality of gate structures comprise a portion of a static random access memory (SRAM) cell.

6. The method of claim 5, wherein said selected gate structure and said selected source/drain contact structure is associated with a pass gate transistor in said SRAM cell, and said conductive line comprises a bit line of said SRAM cell.

7. The method of claim 6, wherein said subset of said plurality of gate structures are associated with a pull-down transistor in said SRAM cell.

8. The method of claim 6, wherein said subset of said plurality of gate structures are associated with a pull-up transistor in said SRAM cell.

9. The method of claim 1, wherein said first dielectric layer comprises a low-k dielectric.

10. The method of claim 1, wherein a remaining portion of said recessed first portion of said conductive source/drain contact structures has a thickness less than half of an original thickness of said conductive source/drain contact structures.

11. A method, comprising:
    forming a static random access memory (SRAM) device above an active region defined in a semiconducting substrate, said SRAM device comprising a plurality of gate structures including a first gate structure associated with a first pass gate transistor and a second gate structure associated with one of a pull-up transistor or a pull-down transistor, and conductive source/drain contact structures positioned adjacent each of said plurality of gate structures;
    recessing a first portion of said conductive source/drain contact structure associated with said one of said pull-up transistor or said pull-down transistor at a first axial position along a first gate structure to define a cavity;
    forming a first dielectric layer in said cavity; and
    forming a conductive line contacting said source/drain contact structure of said one of said pull-up transistor or said pull-down transistor in said first axial position.

12. The method of claim 11, wherein said conductive line has a first axial length in a direction perpendicular to a second axial length of said source/drain contact structure of said one of said pull-up transistor or said pull-down transistor.

13. The method of claim 11, further comprising:
    forming a second dielectric layer above said conductive source/drain contact structures;
    forming a trench in said second dielectric layer exposing said source/drain contact structure of said one of said pull-up transistor or said pull-down transistor; and
    forming said conductive line in said trench.

14. The method of claim 13, further comprising recessing said source/drain contact structure of said one of said pull-up transistor or said pull-down transistor after forming said first dielectric layer and prior to forming said conductive line.

15. The method of claim 11, wherein said first dielectric layer comprises a low-k dielectric.

16. The method of claim 11, wherein a remaining portion of said recessed first portion of said conductive source/drain contact structure associated with said one of said pull-up transistor or said pull-down transistor has a thickness less than half of its thickness prior to said recessing.

* * * * *